United States Patent
Cheng et al.

(10) Patent No.: US 8,724,420 B2
(45) Date of Patent: May 13, 2014

(54) SRAM WRITE ASSIST APPARATUS

(75) Inventors: Chiting Cheng, Taichung (TW);
Chung-Cheng Chou, Hsin-Chu (TW);
Tsung-yung Jonathan Chang,
Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 260 days.

(21) Appl. No.: 13/105,382

(22) Filed: May 11, 2011

(65) Prior Publication Data
US 2012/0287736 A1 Nov. 15, 2012

(51) Int. Cl.
*G11C 11/413* (2006.01)

(52) U.S. Cl.
USPC .......... 365/226; 365/154; 365/189.14

(58) Field of Classification Search
USPC .......... 365/154, 226, 189.14
See application file for complete search history.

(56) References Cited

U.S. PATENT DOCUMENTS

| | | | | |
|---|---|---|---|---|
| 5,546,355 A * | 8/1996 | Raatz et al. | ......... | 365/233.16 |
| 6,657,887 B2 * | 12/2003 | Higeta et al. | ......... | 365/156 |
| 2005/0073341 A1 * | 4/2005 | Lim | ......... | 327/143 |
| 2007/0050651 A1 * | 3/2007 | Cioaca | ......... | 713/300 |
| 2008/0159043 A1 * | 7/2008 | Lee | ......... | 365/226 |
| 2009/0059706 A1 * | 3/2009 | Wong | ......... | 365/226 |
| 2009/0207675 A1 * | 8/2009 | Kengeri et al. | ......... | 365/189.14 |
| 2010/0214860 A1 * | 8/2010 | Upputuri | ......... | 365/206 |
| 2010/0309736 A1 * | 12/2010 | Russell et al. | ......... | 365/189.011 |
| 2012/0057399 A1 * | 3/2012 | Jou et al. | ......... | 365/156 |

OTHER PUBLICATIONS

Kellah, M.M., et al., "Read and Write Circuit Assist Techniques for Improving Vccmin of Dense 6T SRAM Cell," 2008 IEEE, 4 pages.
Nho, H., et al., "A 32nm High-k Metal Gate SRAM with Adaptive Dynamic Stability Enhancement for Low-Voltage Operation," 2010 IEEE, ISSCC, pp. 346-348.
Raychowdhury, A., et al., "PVT-and-Aging Adaptive Wordline Boosting for 8T SRAM Power Reduction," 2010 IEEE, ISSCC, pp. 352-354.
Pilo, H., et al., "A 64Mb SRAM in 32nm High-k Metal-Gate SOI Technology with 0.7V Operation Enabled by Stability, Write-Ability and Read-Ability Enhancements," 2011 IEEE, ISSCC, pp. 254-256.
Takeda, K., et al., "Multi-Step Word-Line Control Technology in Hierarchical Cell Architecture for Scaled-Down High-Density SRAMs," IEEE, Journal of Solid-State Circuits, vol. 46, No. 4, Apr. 2011, pp. 806-814.

* cited by examiner

*Primary Examiner* — Huan Hoang
*Assistant Examiner* — Jay Radke
(74) *Attorney, Agent, or Firm* — Slater and Matsil, L.L.P.

(57) ABSTRACT

An SRAM write assist apparatus comprises a timer unit and a voltage divider. The voltage divider unit is configured to divide a voltage potential down to a lower level. The output of the voltage divider is connected to a memory cell in a write operation. The timer unit is configured to generate a pulse having a width inversely proportional to the voltage potential applied to a memory chip. Furthermore, the timer unit controls the period in which a lower voltage from the output of the voltage divider is applied to the memory cell. Moreover, external level and timing programmable signals can be used to further adjust the voltage divider's ratio and the pulse width from the timer unit. By employing the SRAM write assist apparatus, a memory chip can perform a reliable and fast write operation.

18 Claims, 5 Drawing Sheets

SRAM WRITE ASSIST APPARATUS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as electrically erasable programmable read-only memory (EEPROM) and flash memory.

SRAM cells may comprise different numbers of transistors. According to the total number of transistors in an SRAM cell, the SRAM cell may be referred to as a six-transistor (6-T) SRAM. In an SRAM memory chip, many SRAM cells are arranged in rows and columns. An SRAM cell is selected during either a read operation or a write operation by selecting its row and column. The row and column to be selected are determined by a binary code. For example, a 64 Kb memory chip may employ a 16-bit binary code controlling the write and read operations. More particularly, the 16-bit binary code is split into two separate 8-bit binary codes for selecting a row and a column respectively. The 64 Kb memory chip may further comprise a row decoder and a column decoder. In response to an 8-bit code, the row decoder is able to generate $2^8$ outputs, which comes to 256 outputs. Likewise, the column decoder is able to generate another $2^8$ outputs. By enabling an output from the row decoder and an output from the column decoder, an SRAM cell can be selected from a memory cell array having 256 rows and 256 columns.

Each column of an SRAM cells is connected to both a bit-line (BL) and the inverse of BL ($\overline{BL}$). A data latch of each SRAM cell is used to store a single bit. Both BL and $\overline{BL}$ are used to control the operation of reading a bit from or writing a bit into the SRAM cell. For example, in an SRAM write operation, a logic state "1" stored in a data latch of the SRAM cell can be reset by setting BL to "0" and $\overline{BL}$ to "1". Furthermore, two pass-gate transistors connected between the data latch and BL and $\overline{BL}$ are controlled by a word line. In response to a binary code from the row decoder, the signal of the word line is asserted so that the data latch is selected to proceed to a write operation. During a write operation, one storage node of the data latch is discharged by BL to "0" and the other storage node of the data latch is charged by $\overline{BL}$ to "1". As a result, the new data logic "0" is latched into the SRAM cell.

As semiconductor technologies evolve, the operating voltages of SRAM memory chips are further reduced. The decrease of the operating voltages can reduce SRAM cell power consumption. However, the lower operating voltages of SRAM cells may reduce write and read margins to a low level. Such a low level can cause less reliable write and read operations.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a static random access memory (SRAM) write assist apparatus. The invention may also be applied, however, to a variety of memory circuits.

Figure 1A:
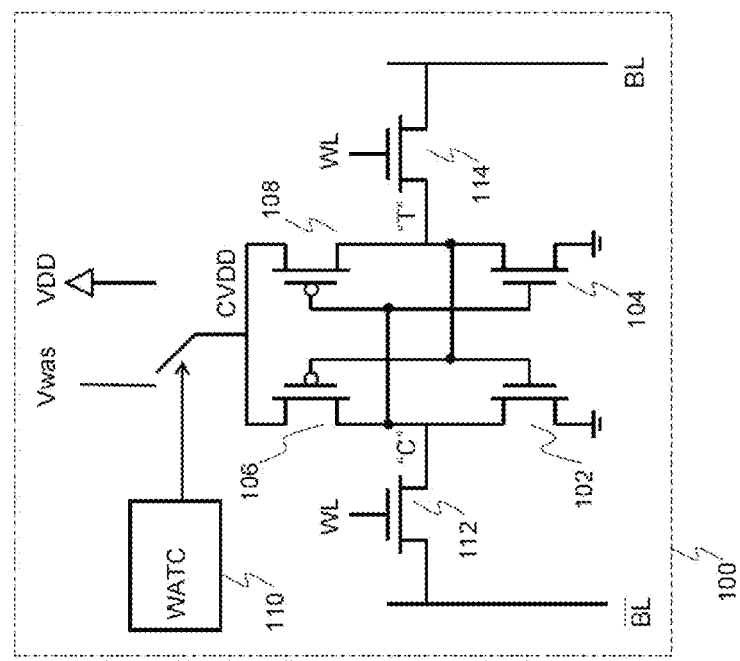
FIG. 1A illustrates a schematic diagram of a static random access memory (SRAM) cell is in accordance with an embodiment.

Referring initially to FIG. 1A, the schematic diagram of an SRAM cell is illustrated in accordance with an embodiment. The SRAM cell 100 comprises a first inverter formed by a pull-up PMOS transistor 106 and a pull-down NMOS transistor 102 and a second inverter formed by a pull-up PMOS transistor 108 and a pull-down NMOS transistor 104. Both the first inverter and second inverter are coupled between a voltage bus CVDD and ground. Furthermore, the first inverter and the second inverter are cross-coupled. That is, the first inverter has an input connected to the output of the second inverter. Likewise, the second inverter has an input connected to the output of the first inverter. The output of the first inverter is referred to as a storage node C and the output of the second inverter is referred to as a storage node T. In a normal operating mode, the storage node C is in the opposite logic state as the storage node T. By employing the two cross-coupled inverters, the SRAM cell 100 can hold the data using a latched structure so that the stored data will not be lost without applying a refresh cycle.

The SRAM cell 100 comprises a first pass-gate NMOS transistor 112 connected between $\overline{BL}$ and the output of the first inverter. The SRAM cell 100 further comprises a second pass-gate NMOS transistor 114 connected between BL and the output of the second inverter. The gates of the first gate-pass NMOS transistor 112 and the second gate-pass NMOS transistor 114 are connected to a word line (WL). During a write operation, $\overline{BL}$ and BL are set to opposite logic values according to the new data that will be written into the SRAM cell 100. When the SRAM cell 100 is selected, a logic high state is applied to WL accordingly. As a result, the storage nodes C and T are connected to $\overline{BL}$ and BL respectively. As a consequence, the logic values at $\overline{BL}$ and BL are written into the storage nodes C and T.

The voltage bus CVDD is configured such that during a write operation, the voltage bus CVDD is coupled to a write assist voltage potential $V_{was}$ through a switch controlled by a write assist timing control unit 110. In contrast, when the SRAM cell 100 is not in a write operation mode, the writing assist timing control unit 110 turns off the connection between the voltage bus CVDD and the write assist voltage potential $V_{was}$ and connects the voltage bus CVDD to a voltage potential VDD. It should be noted that the voltage level of $V_{was}$ is less than the voltage level of VDD. By connecting the voltage bus CVDD to a lower voltage potential during a write operation, the write operation can be faster and easier. The detailed operation of the write assist timing control unit will be described below with respect to FIG. 2.

Figure 1B:
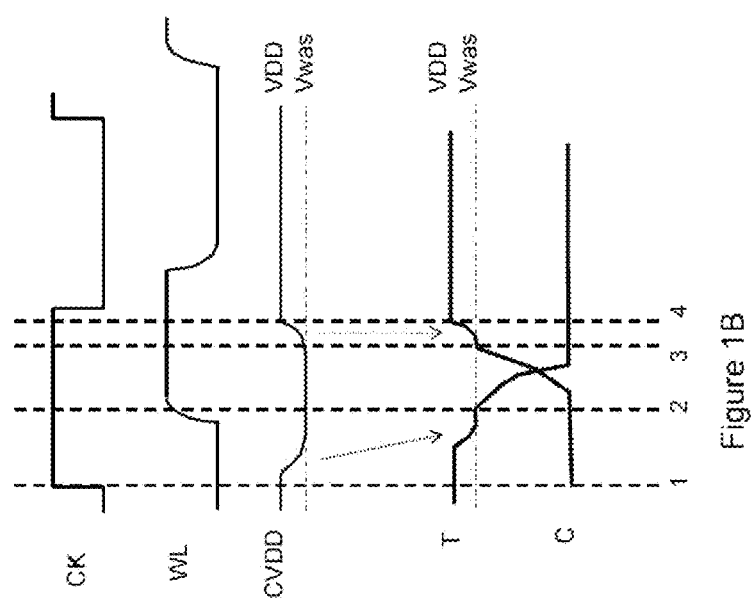
FIG. 1B illustrates a timing diagram that shows a write operation of the SRAM cell shown in FIG. 1A.

FIG. 1B illustrates a timing diagram that shows a write operation of the SRAM cell 100 shown in FIG. 1A. In the present example, assume that the initial logic values stored at the storage node T and the storage node C are logic high and logic low respectively. In order to write a bit into the data latch, both $\overline{BL}$ and BL are set to corresponding logic values. For example, when a logic low state will be written into the storage node T, the bit line BL is set to a logic low state by connecting BL to ground. Likewise, $\overline{BL}$ is set to a logic high state by connecting $\overline{BL}$ to a high voltage potential such as VDD. At the first time instance (labeled by dashed line 1), when the leading edge of a write clock signal arrives, the writing assist timing control unit 110 connects the voltage bus CVDD to the write assist voltage potential $V_{was}$ by toggling the three-terminal switch shown in FIG. 1A. As a result, the voltage at the storage node T drops from VDD to $V_{was}$ because the turned-on pull-up PMOS transistor 108 connects the storage node T to the voltage bus CVDD. On the contrary, there is no impact on the voltage of the storage node C because the pull-up PMOS transistor 106 is off when the gate of the pull-up PMOS transistor 106 is set to high by the storage node T. As shown in FIG. 1B, the voltage of the storage node T stays at $V_{was}$ until the second time instance (labeled by dashed line 2).

At the second time instance, in response to the selection of the SRAM cell 100, the WL signal coupled to the SRAM cell 100 rises from a logic low state to a logic high state. The logic high value at WL turns on both the first pass-gate NMOS transistor 112 and the second pass-gate NMOS transistor 114. Because BL is connected to ground, the turn-on of the second pass-gate transistor 114 starts to pull down the voltage of the storage node T. As shown in FIG. 1B, the voltage at the storage node T is discharged to ground. At the same time, the turn-on of the first pass-gate NMOS transistor 112 provides a channel to charge the voltage of the storage node C to a level clamped by the voltage bus CVDD. It should be noted that during the period between the second time instance and the third time instance, the pull-up PMOS transistor 106 is turned on after the voltage of the storage node T is discharged below the turn-on threshold of the pull-up PMOS transistor 106. As a result, the turned-on pull-up PMOS transistor 106 clamps the voltage of the storage node C to the write assist voltage potential $V_{was}$.

At the third time instance (labeled by dashed line 3), when a predetermined timer (not shown but illustrated in FIG. 2) expires, the writing assist timing control unit 110 re-connects the voltage bus CVDD to the voltage potential VDD by toggling the three-terminal switch shown in FIG. 1A. As a result, the voltage at the voltage bus CVDD is charged up from $V_{was}$ to VDD. At the same time, because the turned-on pull up PMOS transistor 106 connects the storage node T to the voltage bus CVDD, the voltage at the storage node C increases following the same curve as the voltage bus CVDD.

At the fourth time instance, the storage node C reaches a voltage level of VDD. On the contrary, during the same period, there is no impact on the voltage of the storage node T because the pull-up PMOS transistor 108 is off when the gate of the pull-up PMOS transistor 108 is set to high by the storage node C. An advantageous feature of having a write assist voltage potential $V_{was}$ is that the operating voltage of the SRAM cell 100 is pre-discharged to a lower level before the write operation so that the storage node having a logic high state can be reliably discharged to ground.

Figure 2:
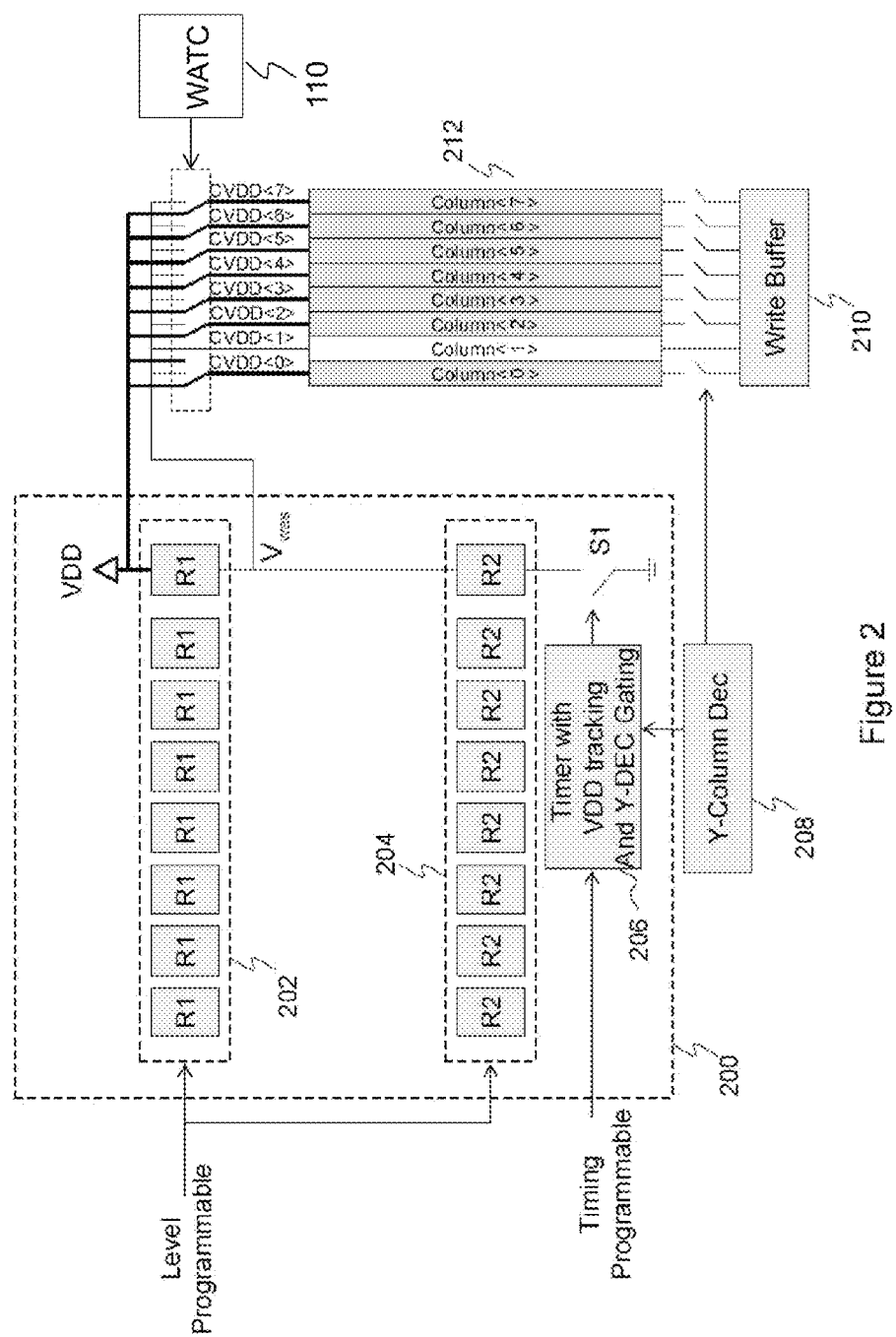
FIG. 2 illustrates an example memory chip employing the write assist voltage and timing shown in FIG. 1A and FIG. 1B.

FIG. 2 illustrates an example memory chip employing the write assist voltage and timing shown in FIG. 1A and FIG. 1B. In the example memory chip 212, there may be eight columns of memory cells. Each column may comprise a plurality of SRAM cells. Each column of the memory chip 212 has a voltage bus CVDD connected to either the voltage potential VDD or the write assist voltage potential $V_{was}$ through a three terminal switch. On the other hand, each column of the memory chip 212 is also connected to a write buffer 210 through a switch. The write buffer 210 is used to hold the data transferred from an external source. The function of the write buffer 210 is known in the art, and hence is not discussed in detail herein. A Y-column decoder 208 is used to select one column into which the data will be written. More particularly, the Y-column decoder receives a binary code for example an n-bit address and generates $2^n$ outputs, one of which is activated. In the present example, the Y-column decoder 208 receives a 3-bit address and translates the 3-bit address into eight outputs. One of the outputs such as the second output coupled to the first column is activated. In response to the output of the Y-column decoder 208, the first column of the memory chip is operating in a write operation mode.

During a write operation, the operating voltage bus of the memory chip 212 is coupled to an SRAM write assist apparatus 200. The SRAM write assist apparatus 200 may comprise a first resistor panel 202, a second resistor panel 204 and a timer unit 206. It should be noted that the resistors of the first resistor panel 202 or the second resistor panel 204 can be formed by either NMOS transistors or PMOS transistors operating in their linear region. Moreover, as known in the art, the resistors can also be formed by polysilicon. While not a limitation on the scope of the presently claimed invention, it is believed that the resistors the range of 10 k Ohm to 100 k Ohm would be preferable. In order to illustrate the inventive aspects of various embodiments, in the present example, each resistor panel only comprises eight resistors. One resistor in the first resistor panel 202, the corresponding resistor in the second resistor patent 204 and a switch S1 are connected in series between the voltage potential VDD and ground so as to form a voltage divider. The voltage divider provides a scale-down voltage for a column of the memory chip 212. For example, when Column 1 of the memory chip 212 is selected, the corresponding voltage divider is activated by turning on the switch S1 connected in series with R1 and R2. In particular, the Y-column decoder 208 sends a control signal to the timer unit 206, which turns on a particular switch in response to the control signal. In the present example, the switch S1 is turned on. Accordingly, a voltage determined by the following equation is applied to the voltage bus of Column 1 of the memory chip 212.

$$V_{was} = VDD \frac{R2}{R1 + R2}$$

At the same time, the timer unit 206 does not turn on the rest of the switches connected to other dividers. As a result, a voltage level of VDD is applied to other columns. In addition, the control signal from the timer unit 206 is a pulse signal whose width is adjustable based upon the voltage level of VDD. The detailed operation of the timer unit 206 will be described below with respect to FIG. 3. The SRAM write assist apparatus 200 may comprise a level programmable device (not shown) wherein the level programmable device adjusts one voltage divider's ratio in response to a received level programmable signal. Furthermore, The SRAM write assist apparatus 200 may comprise a timing programmable device (not shown) wherein the timing programmable device adjusts a width of a pulse generated by the timer unit 206 in response to a received timing programmable signal. In sum, a voltage divider's ratio and the width of a pulse generated by the timer unit 206 can either be predetermined or be dynamically adjusted through two external signals coupled to the SRAM write assist apparatus 200.

Figure 3:
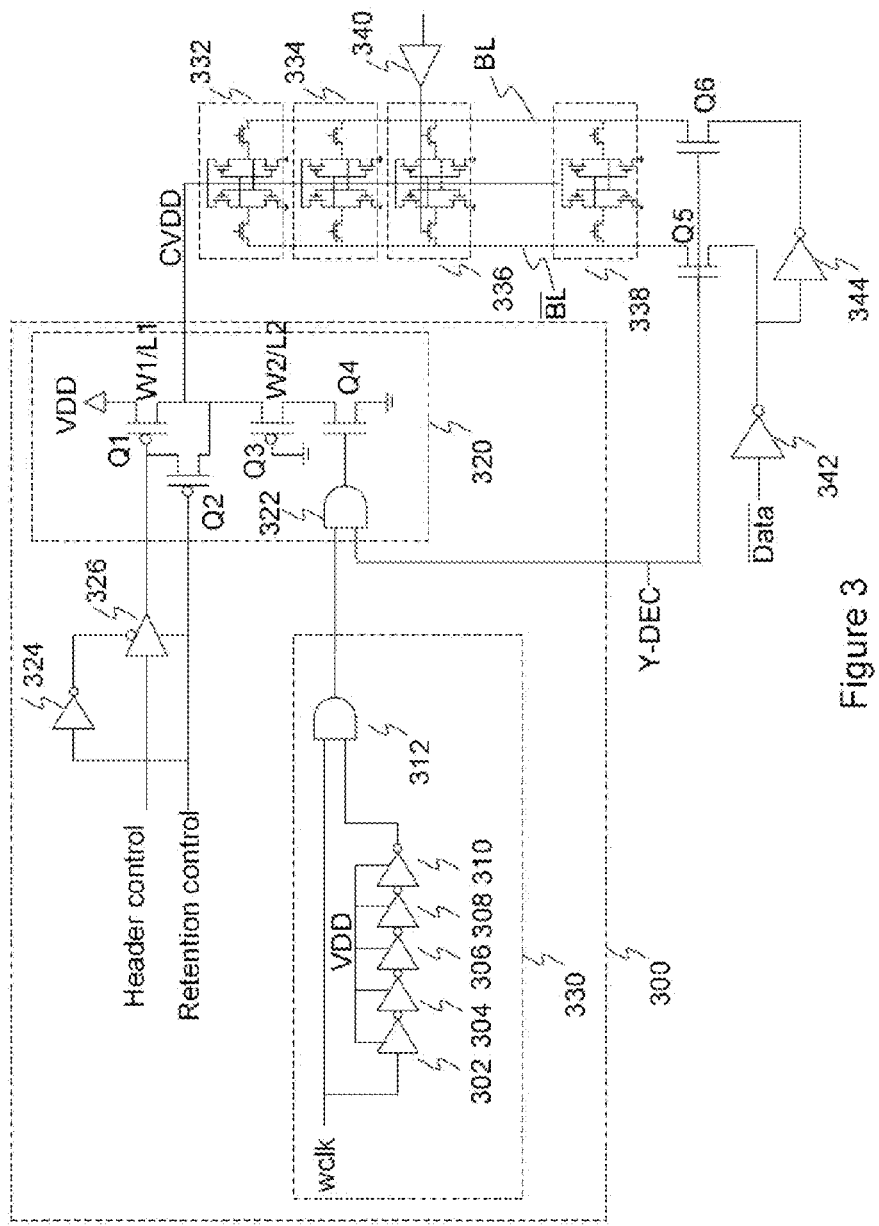
FIG. 3 illustrates a schematic diagram of the implementation of an SRAM write assist apparatus for driving a column of the memory chip shown in FIG. 2.

FIG. 3 illustrates a schematic diagram of the implementation of an SRAM write assist apparatus for driving a column of the memory chip shown in FIG. 2. The column of memory chip may comprise four SRAM cells, namely 332, 334, 336 and 338. The operating voltage buses of four SRAM cells are connected together and collectively called CVDD. The voltage bus CVDD is connected to an output of the SRAM write assist apparatus 300. Each SRAM cell (e.g., SRAM cell 332) has a $\overline{BL}$ line connected to the drain of an NMOS transistor Q5. As shown in FIG. 3, the BL line of the column is connected to the drain of an NMOS transistor Q6. The source of the NMOS transistor Q5 is connected to $\overline{Data}$ via a first inverter 342. The source of the NMOS transistor Q6 is connected to the source of the NMOS transistor Q5 via a second inverter 344.

In a write operation, an output Y-DEC from the Y-column decoder (not shown but illustrated in FIG. 2) is used to select the column in which the SRAM cell is located. When the column is selected, the output Y-DEC is set to a logic high state. Such a logic high state turns on both the NMOS transistor Q5 and the NMOS transistor Q6. The data to be written into the SRAM cell are sent to the data latch of the SRAM cell via the turned-on NMOS transistor Q5 and NMOS transistor Q6. For example, when $\overline{Data}$ has a logic low state, the output of the first inverter 342 has a logic high state. As a result, the $\overline{BL}$ line is connected to a high voltage potential via the turned-on NMOS transistor Q5. At the same time, through the second inverter 344, the output of the first inverter 342 is inverted and a logic low state is generated at the output of the second inverter 344. As described above, the NMOS transistor Q6 is turned on in response to a write operation. Accordingly, the BL line is connected to a logic low state. In accordance with an embodiment, when a write operation starts, the signal of the WL line driver 340 is asserted. As a result, the two pass-gate transistors of the SRAM cell 336 are turned on. The logic states on the $\overline{BL}$ and BL lines are written into the SRAM cell 336. The detailed timing diagram of a write operation has been discussed with respect to FIG. 1A and FIG. 1B, and hence is not described herein to avoid repetition.

The SRAM write assist apparatus 300 is employed to adjust the scale of a voltage drop as well as the duration of the voltage drop. The SRAM write assist apparatus 300 comprises a timer unit 330 and a voltage divider 320. The timer unit 330 comprises five inverters connected in series. It should be noted while FIG. 3 illustrates five inverters, the timer unit 330 may include a plurality of inverters. The number of inverters illustrated herein is limited solely for the purpose of clearly illustrating the inventive aspects of the various embodiments. The present invention is not limited to any specific number of inverters. The five inverters, namely 302, 304, 306, 308 and 310 are further powered by the voltage potential VDD. As known in the art, the propagation delay of an inverter is inversely proportional to the supply voltage of the inverter. As a result, the total propagation delay from the inverter chain increases when the supply voltage VDD decreases. After passing the AND gate 312, the pulse signal generated at the output of the AND 312 has a width inversely proportional to VDD. By employing the timer unit 330, the SRAM write assist apparatus 300 generates a control signal having a pulse width inversely proportional to VDD.

The voltage divider 320 is a multifunction device. By applying different control signals, the voltage divider 320 can be a resistor divider for dividing VDD down to a lower voltage, a header control device to save power dissipation or a retention control device by which the supply voltage drops to a level below the normal operation voltage while holding data in SRAM cells. When the voltage divider 320 is operating in a resistor divider mode, the PMOS transistor Q1 and the PMOS transistor Q3 are in their linear region. Q1 and Q3 are equivalent to two resistors connected in series. Furthermore, by adjusting the parameters of Q1 and Q3 such as the channel length L1 or L2, the resistance values of Q1 and Q3 change accordingly. As a result, the resistor divider can provide an adjustable voltage connected to CVDD during a write operation. It should be noted that the NMOS transistor Q4 is an optional device. The output of the AND gate 322 can be coupled to the gate of the PMOS transistor Q3 directly. The PMOS transistor Q3 can be used as both a resistor and a switch. For example, when a logic high state is applied to the gate of the PMOS transistor Q3, the PMOS transistor Q3 functions as a switch and the voltage divider 320 is disabled accordingly. On the other hand, when an appropriate voltage is applied to the gate of the PMOS transistor Q3, Q3 operates in its linear region. Q1 and Q3 form a voltage divider and divide the voltage potential VDD down to a lower voltage.

When the voltage divider 320 is operating in a header control mode, the PMOS transistor Q1 is turned off in response to a logic high state of the header control signal. The turned-off PMOS transistor Q1 cuts off the leakage path between VDD and SRAM cells. As a result, unnecessary power dissipation can be saved. Alternatively, the voltage divider 320 can be used to achieve retention control. As shown in FIG. 3, when the voltage divider 320 is operating in a retention mode, the PMOS transistor Q2 is turned on. As a consequence, the gate of and the drain of the PMOS transistor Q1 are connected together acting as a diode. Such a diode connected PMOS transistor causes an approximately 0.7V drop from VDD. By connecting CVDD to the drain of the PMOS transistor Q1, CVDD has a voltage less than the normal operating voltage while keeping the data stored in the SRAM cells. An advantageous feature of having the voltage divider 320 is that multiple functions can share one single device through different control signals. Therefore, the extra die area for implementing the write assist apparatus can be compensated by multiple functions derived from the same apparatus.

Figure 4:
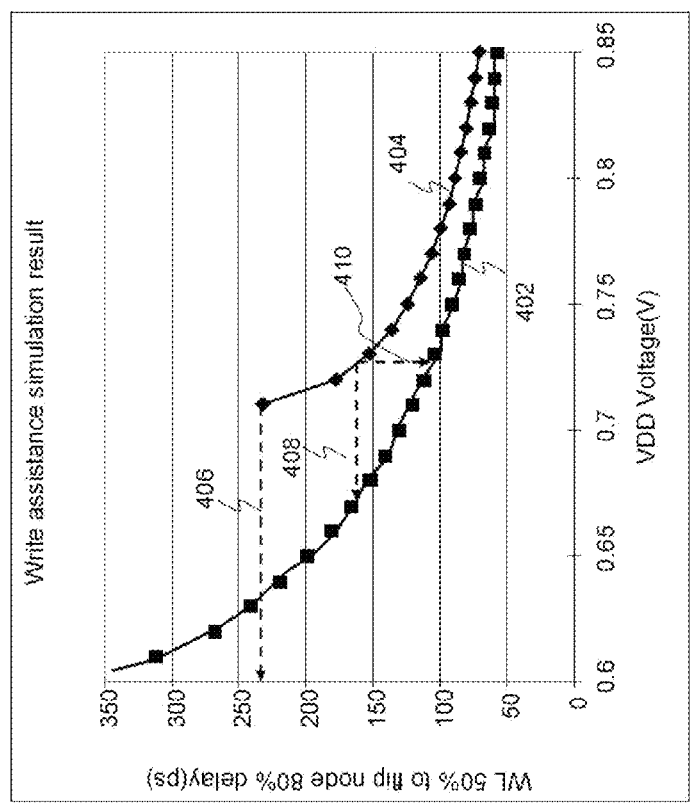
FIG. 4 illustrates simulation results based upon the SRAM write assist apparatus shown in FIG. 3.

FIG. 4 illustrates simulation results based upon the SRAM write assist apparatus shown in FIG. 3. The horizontal axis of FIG. 4 represents the supply voltage at VDD. The vertical axis of FIG. 4 represents the delay between a write control signal and an 80% finish of the write operation. A curve 402 gives a relationship between the supply voltage and the corresponding delay for finishing a write operation when a write assist apparatus is employed. In accordance with an embodiment, the operating voltage can be as low as 0.6V. In contrast, a curve 404 gives a relationship between the supply voltage and the corresponding delay for finishing a write operation when the write assist apparatus is not employed. Under the same operating environment, the curve 404 shows the lowest voltage for a reliable write operation is 0.72V. The curve 406 depicts the improvement (approximately 0.12V) by employing the write assist apparatus. The speed of writing data in an SRAM cell is another performance index commonly used to evaluate a write operation. As shown in FIG. 4, at the same operating voltage (e.g., 0.73V labeled by dashed line 410), the vertical difference between the curve 402 and the curve 404 shows by employing the write assist apparatus, the total delay time is reduced by approximately 50 picoseconds. Alternatively, when the speed of a write operation is specified to a fixed value such as 160 picoseconds, by employing the write assist apparatus, the supply voltage for a reliable write operation can be further reduced by approximately 0.6V as indicated by the curve 408. The curves in FIG. 4 show another advantageous feature of the write assist apparatus is that the write assist apparatus not only improves the write speed, but also increase the range of the supply voltage of SRAM cells.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
    a timer unit configured to generate a pulse having a width inversely proportional to a voltage potential applied to a memory chip; and
    a voltage divider unit configured to divide the voltage potential down to a lower level, wherein an input of the voltage divider is coupled to an output of the timer unit, and wherein the voltage divider unit's ratio is adjustable through a level programmable device in response to a received level programmable signal, and wherein the voltage divider unit comprises a first p-type metal oxide semiconductor (PMOS) transistor having a source coupled to the voltage potential and a second PMOS transistor having a source coupled to a drain of the first PMOS transistor and a drain coupled to ground, and wherein a gate of the first PMOS transistor and a gate of the second PMOS transistor are configured such that:
        both the first PMOS transistor and the second PMOS transistor are operating in their linear region during a write operation; and
        in response to a signal generated by the timer unit, the second PMOS transistor is turned off so that the voltage potential is applied to the memory chip.

2. The apparatus of claim 1, wherein the timer unit comprises:
    a delay element comprising a plurality of inverters connected in series; and
    an AND gate comprising:
        a first input coupled to a timer control signal;
        a second input coupled to an output of the delay element; and
        an output coupled to the input of the voltage divider.

3. The apparatus of claim 1, wherein the voltage divider unit comprises:
    a first PMOS transistor having a source coupled to the voltage potential;
    a second PMOS transistor having a source coupled to a drain of the first PMOS transistor; and
    a first n-type metal oxide semiconductor (NMOS) transistor having a drain coupled to a drain of the second PMOS transistor and a source coupled to ground.

4. The apparatus of claim 3, wherein a gate of the first PMOS transistor, a gate of the second PMOS transistor and a gate of the first NMOS transistor are configured such that:
    both the first PMOS transistor and the second PMOS transistor are operating in their linear region during a write operation; and
    in response to a signal generated by the timer unit, the first NMOS transistor is turned off so that the voltage potential is applied to the memory chip.

5. The apparatus of claim 1, further comprising:
    a header control unit having an input configured to receive a header control signal and an output coupled to a gate of a first PMOS transistor of the voltage divider unit; and
    a retention control unit having an input configured to receive a retention control signal and an output coupled to a gate of a transistor coupled between the gate of the first PMOS transistor and a drain of the first PMOS transistor.

6. The apparatus of claim 5, wherein the header control unit and the retention control unit are configured such that:
    the first PMOS transistor is turned off when a header control signal generated by the head control unit is asserted; and
    the transistor and the first PMOS transistor form a diode connected transistor when a retention control signal generated by the retention control unit is asserted.

7. The apparatus of claim 1, wherein:
    the voltage potential is in a range from 0.6 V to 0.85 V.

8. A system comprising:
    a memory chip comprising a plurality of memory cells arranged in an array, wherein one memory cell in a write operation is configured to receive an operating voltage divided down from a voltage potential; and
    a write assist apparatus comprising:
        a timer unit configured to generate a pulse having a width inversely proportional to the voltage potential applied to the memory chip; and
        a plurality of voltage dividers, each of which is configured to divide the voltage potential down to a lower voltage and send the lower voltage to a corresponding memory cell when the corresponding memory cell is operating in a write operation mode, wherein one voltage divider's ratio is adjusted by a level programmable device in response to a received level programmable signal, and wherein the voltage divider comprises a first p-type metal oxide semiconductor (PMOS) transistor having a source coupled to the voltage potential and a second PMOS transistor having a source coupled to a drain of the first PMOS transistor and a drain coupled to ground, and wherein a gate of the first PMOS transistor and a gate of the second PMOS transistor are configured such that:
            both the first PMOS transistor and the second PMOS transistor are operating in their linear region during a write operation; and
            in response to a signal generated by the timer unit, the second PMOS transistor is turned off so that the voltage potential is applied to the memory chip.

9. The system of claim 8, further comprising a Y-column decoder having an input configured to receive a binary code and a first output coupled to an input of the timer unit and a second output coupled to an input of the memory chip.

10. The system of claim 9, wherein the timer unit and the memory chip is configured such that:
   in response to a signal generated by the Y-column decoder, the timer unit enables a voltage divider coupled to a memory cell in a write operation mode; and
   in response to the signal generated by the Y-column decoder, a write operation is performed on the memory cell.

11. The system of claim 8, wherein the memory cell is a static random access memory (SRAM) cell comprising:
   a data latch formed by a pair of cross-coupled inverters comprising a first storage node and a second storage node;
   an operating voltage bus coupled to one terminal of the data latch via a control circuit;
   a first pass-gate transistor coupled between a first column select line and a first inverter of the data latch, wherein a gate of the first pass-gate transistor is coupled to a word line; and
   a second pass-gate transistor coupled between a second column select line and a second inverter of the data latch, wherein a gate of the second pass-gate transistor is coupled to the word line.

12. The system of claim 11, wherein the control circuit is configured such that:
   the operating voltage bus is disconnected from the data latch when the memory cell is selected in a write mode; and
   the operating voltage bus is coupled to the data latch when the memory cell is unselected in the write mode.

13. The system of claim 8, further comprising a timing programmable device wherein the timing programmable device adjusts a width of a pulse generated by the timer unit in response to a received timing programmable signal.

14. A method comprising:
   selecting a memory cell from a plurality of memory cells arranged in rows and columns;
   disconnecting the memory cell from an operating voltage potential;
   connecting the memory cell to a lower voltage, wherein the lower voltage is adjustable through a level programmable device in response to a received level programmable signal;
   re-connecting the memory cell to the operating voltage potential after a period controlled by a timer unit;
   turning off a first p-type metal oxide semiconductor (PMOS) transistor of a voltage divider when a header control signal generated by a head control unit is asserted; and
   forming a diode connected transistor by turning on a transistor coupled between a gate and a drain of the first PMOS transistor when a retention control signal generated by a retention control unit is asserted.

15. The method of claim 14, wherein a voltage divider is used to divide the operating voltage potential to the lower voltage.

16. The method of claim 14, further comprising:
   adjusting one voltage divider's ratio in response to the received level programmable signal; and
   adjusting a width of a pulse generated by the timer unit in response to a received timing programmable signal.

17. The method of claim 14, further comprising:
   selecting the memory cell and a corresponding voltage divider from a plurality of voltage dividers of a write assist apparatus;
   connecting an output of the corresponding voltage divider to the memory cell;
   discharging a first storage node of the memory cell down to a voltage level equal to the output of the corresponding voltage divider; and
   during a write operation, discharging the first storage node of the memory cell down to zero volts.

18. The method of claim 17, further comprising:
   charging a second storage node of the memory cell from zero volts to a voltage level equal to the output of the corresponding voltage divider; and
   charging the second storage node of the memory cell up to the operating voltage potential.

* * * * *